(12) United States Patent
Pellizzer et al.

(10) Patent No.: US 8,358,532 B2
(45) Date of Patent: Jan. 22, 2013

(54) WORD-LINE DRIVER INCLUDING PULL-UP RESISTOR AND PULL-DOWN TRANSISTOR

(75) Inventors: Fabio Pellizzer, Cornate d'Adda (IT); Agostino Pirovano, Corbetta (IT); Andrea Redaelli, Lecco (IT); Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 367 days.

(21) Appl. No.: 12/621,933

(22) Filed: Nov. 19, 2009

(65) Prior Publication Data

US 2010/0165724 A1  Jul. 1, 2010

(30) Foreign Application Priority Data

Dec. 31, 2008 (WO) .................. PCT/IT2008/000822

(51) Int. Cl.
*G11C 11/00* (2006.01)
*G11C 8/08* (2006.01)
*H01S 4/00* (2006.01)

(52) U.S. Cl. ..................... 365/163; 365/148; 365/230.06

(58) Field of Classification Search ................... 365/163, 365/148, 156, 230.06
See application file for complete search history.

(56) References Cited

U.S. PATENT DOCUMENTS

| | | | |
|---|---|---|---|
| 2,663,806 A | | 12/1953 | Darlington |
| 5,453,949 A | * | 9/1995 | Wiedmann et al. ........... 365/156 |
| 5,761,135 A | | 6/1998 | Lee |
| 6,552,575 B2 | * | 4/2003 | Barnes et al. ................. 326/105 |
| 6,888,770 B2 | * | 5/2005 | Ikehashi ........................ 365/205 |
| 7,203,087 B2 | * | 4/2007 | Resta et al. .................... 365/148 |
| 2003/0214847 A1 | | 11/2003 | Brucke |
| 2007/0165479 A1 | | 7/2007 | Rehm |
| 2008/0037358 A1 | | 2/2008 | Yabuuchi |
| 2008/0173861 A1 | | 7/2008 | Choi |

FOREIGN PATENT DOCUMENTS

EP  0829881 A2  3/1998

OTHER PUBLICATIONS

Theodore F. Bogart, Jr.: "Introduction to Digital Circuits," 1992, MacMillan/McGraw-Hill, Singapore, XP002523353, pp. 324-326, figures 10.6, 10.7, 10.8.

* cited by examiner

*Primary Examiner* — Hoai V Ho
*Assistant Examiner* — Tri Hoang
(74) *Attorney, Agent, or Firm* — Dorsey & Whitney LLP

(57) ABSTRACT

Embodiments include but are not limited to apparatuses and systems including a plurality of memory cells, each memory cell including a selector and a storage element coupled to the selector. A word-line may be coupled to the memory cells and may have a word-line driver including a pull-up resistor coupled to the selectors for the memory cells to access respective storage elements of the memory cells. Other embodiments may be described and claimed.

15 Claims, 10 Drawing Sheets ns in conjunc-
WORD-LINE DRIVER INCLUDING PULL-UP RESISTOR AND PULL-DOWN TRANSISTOR

CROSS-REFERENCE TO RELATED APPLICATIONS

The present application is a direct national filing claiming priority to International Patent Application No. PCT/IT08/00822, filed 31 Dec. 2008, entitled "Word-Line Driver Including Pull-Up Resistor and Pull-Down Transistor," the specification of which is incorporated by reference herein.

TECHNICAL FIELD

Embodiments of the present disclosure relate generally to memory devices, and more particularly, to word-line drivers including a pull-up resistor and/or a pull-down transistor.

BACKGROUND

The demand for increasingly smaller devices has posed a number of challenges. One area in particular is memory devices including arrays of transistors including, for example, bipolar junction transistors (BJTs). The BJT arrays may include large numbers of individual memory cells, reducing the number of which is not typically an option due to the desire for increased memory capacity. Decoding and driving circuitry, usually located at the edges of the memory array, are generally necessary for accessing the memory cells of the memory array, but oftentimes consume a significant area of the overall size of the memory device.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present disclosure, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present disclosure may be shown and described as including a particular number of components or elements, embodiments of the disclosure are not limited to any particular number of components or elements.

Figure 1:
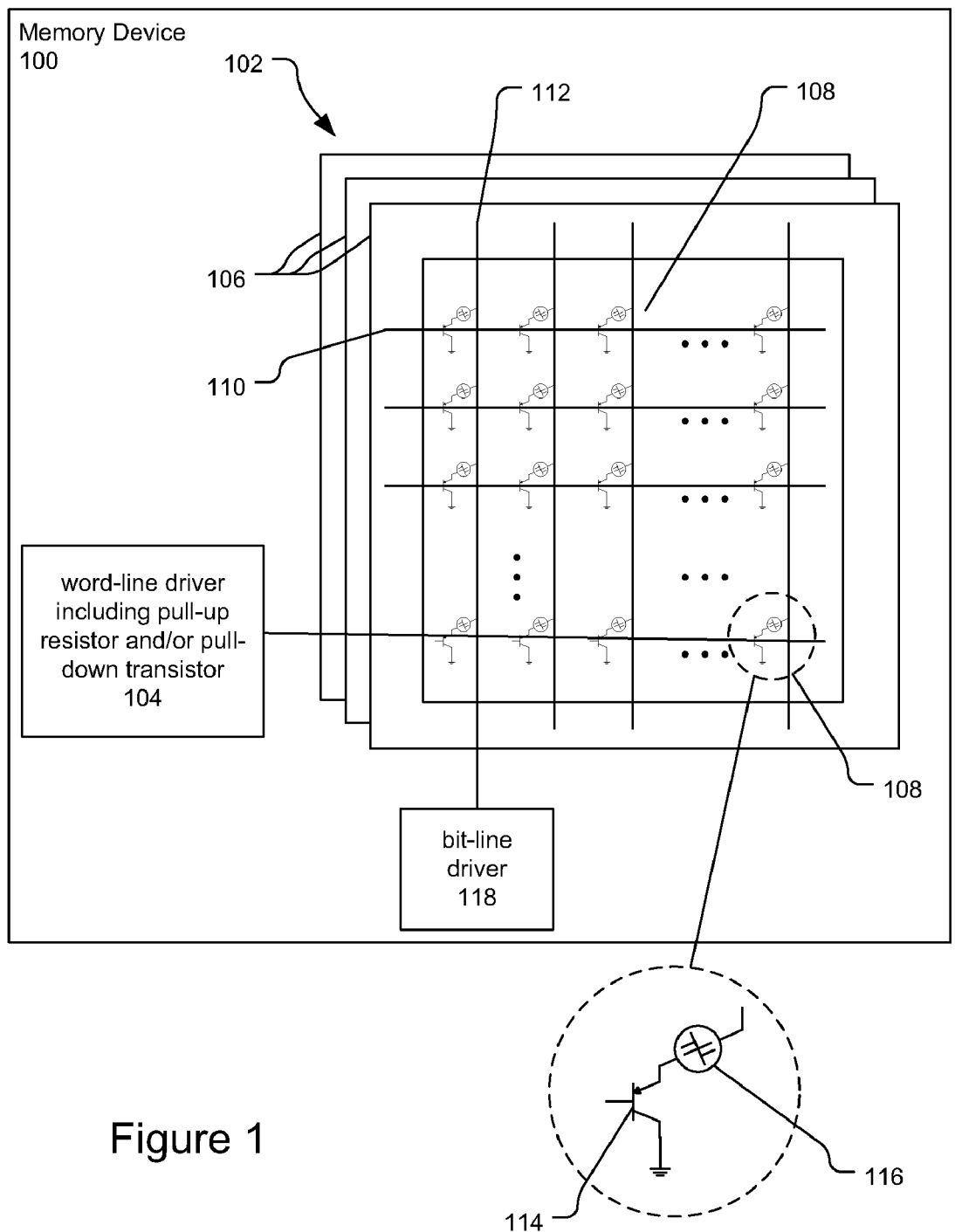
FIG. 1 illustrates a memory device including a word-line driver in accordance with various embodiments.

Turning now to FIG. 1, illustrated is a memory device 100 in accordance with various embodiments of the disclosure. In various embodiments, the memory device 100 may include a memory array 102 including a plurality of addressable memory banks 106. Each memory bank may include a similarly-constituted plurality of memory cells 108 (e.g., a plurality of flash memory cells) coupled to word-lines 110 (rows) and bit-lines 112 (columns). Each memory bank 106 may contain addressable blocks (or sectors) of memory cells 108.

The memory array 102 may include any suitable memory array including, for example, phase change memory. In various other embodiments, the memory array 102 may include an array of memory cells that are each formed by a floating gate metal oxide semiconductor (MOS) transistor or other transistor or transistor-like technologies. In various embodiments, the memory array may include any suitable non-volatile memory such as, but not limited to, NOR flash memory, NAND flash memory, etc.

For the illustrated embodiment, the memory array 102 is phase-change memory comprising memory cells 108 each including a selector 114 and a storage element 116 coupled to the selector 114. The storage elements 116 comprise phase-change material. The selectors 114 comprise a pnp bipolar junction transistor (BJT) having a base coupled to the word-line 110. In various other embodiments, the phase-change memory may be configured differently. For example, the selectors 114 may comprise any suitable switch (e.g., MOS-FET, diode, or other switch).

Data stored in the memory array 102 may be accessed by way of commands provided to the memory device 100. The memory device 100 may include decoding and driving circuitry for accessing the memory cell contents. In various embodiments, for example, one memory cell 108 may be selected when the bit-line 112 is high while the word-line 110 is at ground, or vice versa. Data may be input and output by way of suitable write and read circuitry including, for example, sense amplifiers for read operations as well as analog circuitry for controlling programming and erase voltage generators and controlling the duration of voltage pulses to the memory array 102.

As illustrated, at least one of the word-lines 110 may include a word-line driver 104 and at least one of the bit-lines 112 may include a bit-line driver 118. The word-line driver 104 may include a pull-up resistor and/or a pull-down transistor, which may allow the word-line driver 104 to occupy a reduced area relative to typical word-line drivers including both a pull-up transistor and a pull-down transistor. Moreover, as the memory device 100 typically includes as many word-line drivers 104 as there are rows 110, a reduction in size of each word-line driver 104 may result in a substantial overall reduction in size of the memory device 100.

Figure 2:
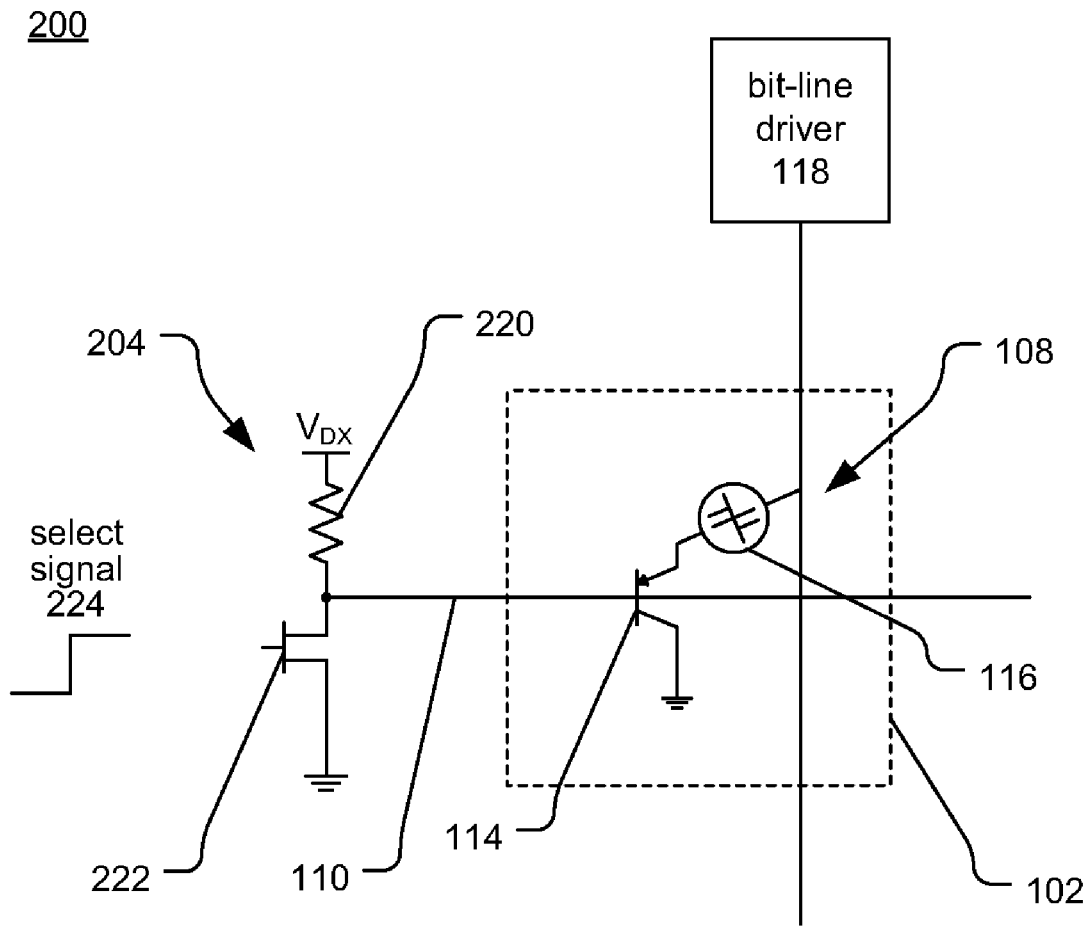
FIG. 2 is a circuit diagram of an example memory device including a word-line driver in accordance with various embodiments.

An example embodiment of a memory device 200 is illustrated at FIG. 2. As illustrated, the memory device 200 includes a bit-line driver 118 and a word-line driver 204. The word-line driver 204 includes a passive pull-up resistor 220 coupled to the memory array 102. Although the illustrated memory array 102 depicts only a single memory cell 108 including a selector 114 and a storage element 116 for simplicity, it is generally understood that the memory array 102 may include up to thousands of memory cells or more.

The pull-up resistor 220 may be coupled to the selectors 114, by way of the word-line 110, for accessing respective storage elements 116 of the memory cells 108. The pull-up resistor 220 may be configured to passively deliver a deselecting voltage $V_{DX}$ to the memory array 102. As illustrated, the word-line driver 204 further includes an n-type metal-oxide-semiconductor (nMOS) transistor 222 having a drain coupled to the pull-up resistor 220 and the selectors 114 of the memory cells 108. The gate of the nMOS transistor 222 is configured to receive the select signal 224 for accessing the respective storage elements 116 of the memory cells 108. Accordingly, when the select signal 224 is low, the word-line 110 is passively driven high to $V_{DX}$. On the other hand, when the select signal 224 is high, the word-line 110 is driven low (e.g., to ground as illustrated or to some other voltage lower than $V_{DX}$).

Figure 3A:
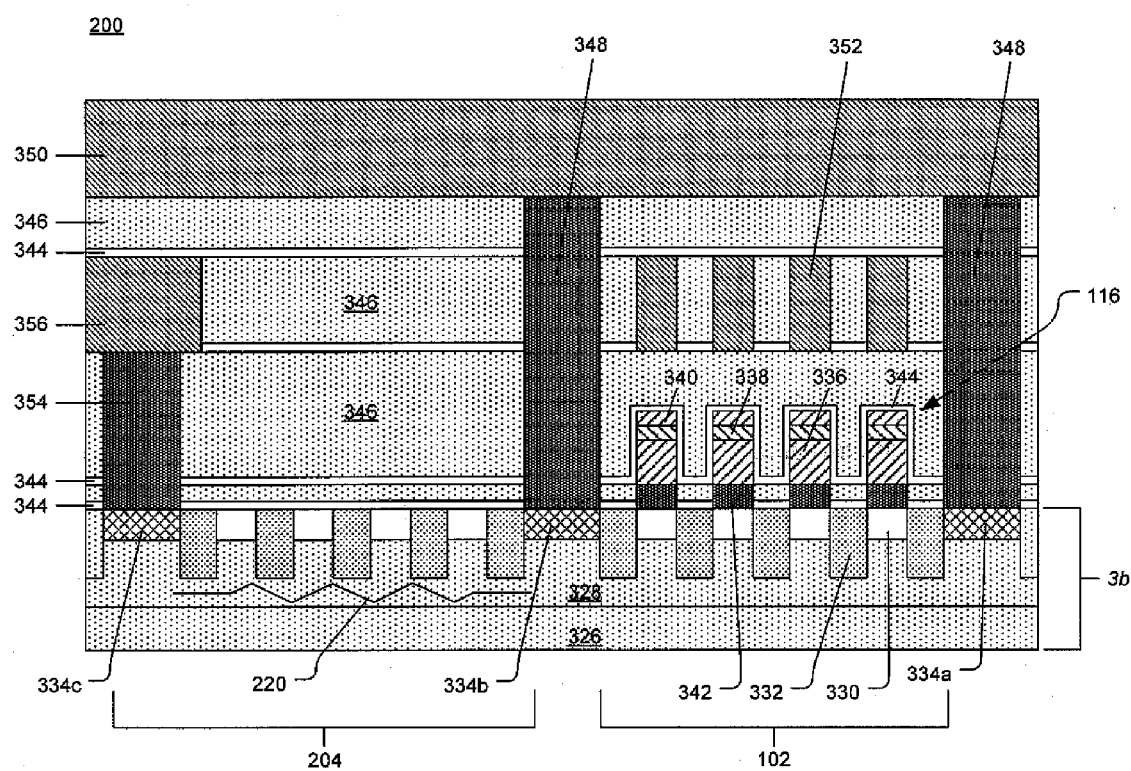
FIGS. 3a, 3b, and 3c illustrate an example architecture of the memory device of FIG. 2.
Figure 3B:
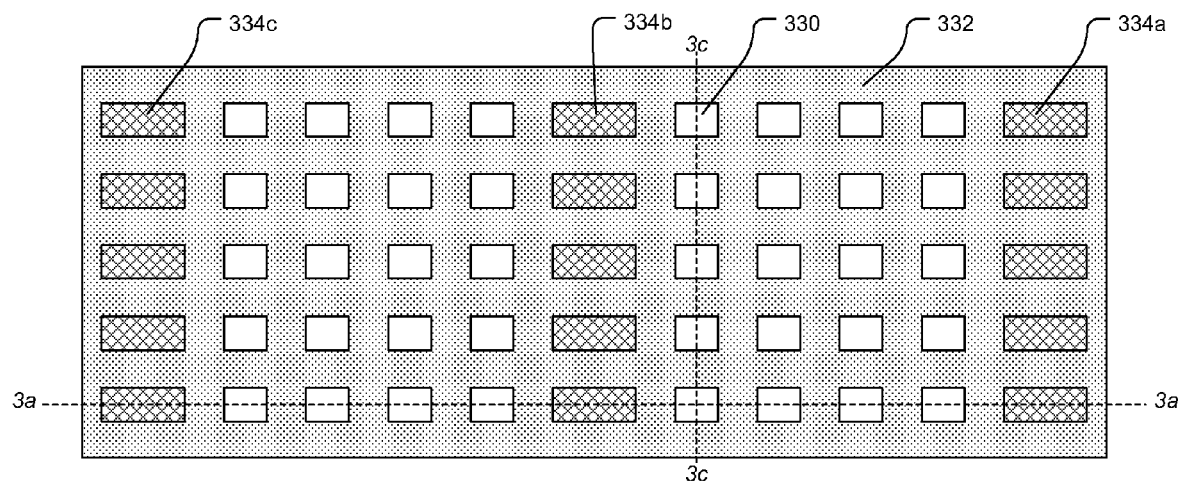

Referring now to FIGS. 3a and 3b, with continued reference to FIG. 2, an example architecture of the memory device 200 of FIG. 2 is depicted. Features similar to those illustrated in FIGS. 3a and 3b are denoted using the same reference numerals, and thus, may not be described again.

Figure 3C:
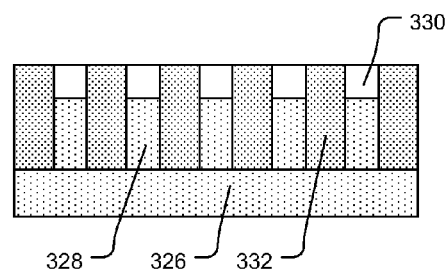

In these embodiments, the pull-up resistor 220 may be realized by using the diffused resistance of the n-type base of the BJT selectors 114. As illustrated in FIGS. 3a, 3b, and 3c, the memory array 102 may be formed from an array of vertical pnp BJTs. FIG. 3a is a cross-section of the memory device 100 along the word-line of the memory array 102, while FIG. 3b is a top view of the memory device 100 with all layers removed except for section 3b and FIG. 3c is a cross-section of the memory device 100 as illustrated in FIG. 3b (i.e., with all layers removed except for section 3b).

The array of vertical pnp BJTs (the selectors 114 as illustrated in FIG. 1) may be formed from a p-type collector layer 326, an n-type base layer 328 formed on the collector layer 326, and a p+ emitter layer 330 formed on the base layer 328. Isolation structures 332 (e.g., shallow trench isolation comprising a suitable dielectric material) separate the emitter layer 330 into a series of emitter fingers, each finger constituting the emitter of a BJT selector.

The phase-change storage elements 116 may be formed from a heater element 336, a layer of phase-change material 338 on the heater element 336, and a conductive cap layer 340 on the layer of phase-change material 338. Conductive contacts 342 (e.g., tungsten) may electrically connect the phase-change storage elements 116 with the emitters 330 of the individual BJTs (i.e., the selectors). A sealing layer 344 may be formed over the phase-change storage elements 116.

Although phase-change storage elements 116 may be formed of any material suitable for the purpose, the layer of phase-change material 338 may comprise germanium/antimony/tellurium (GST) or another suitable chalcogenide.

The memory device 200 may include one or more layers of dielectric material 346 and/or one or more sealing layers 344 formed between the various layers and structures of the memory device 200.

The word-lines of the memory cells (the BJTs and the phase-change storage elements 116) may be bounded by n+ straps 334a, 334b as illustrated. The n+ straps 334a, 334b may be connected to interconnects 348 (e.g., tungsten), which are connected to routing lines 350 (e.g., copper) forming the word-line. The bit-lines may be connected to another set of routing lines 352, by interconnects (not illustrated).

As noted above, the word-line driver 204 including the pull-up resistor 220 may be realized by using the diffused resistance of the n-type base of the BJT selectors. As illustrated, the base layer 328 can be formed to extend beyond the memory array 102 itself. In fact, the entire BJT structure including the collector layer 326, base layer 328, and emitter layer 330 may simply be formed to be larger than that used for the memory array 102 such that no additional processing may be needed. In some embodiments, the emitter layer 330 may be omitted in the word-line driver 204 area by screening the emitter implant in this area. The n+ implant used for forming the n+ straps 334a, 334b, 334c may instead be applied to this area (e.g., when forming the n+ straps 334a, 334b, 334c). In various embodiments, no further implant (i.e., in addition to the implant used for forming the base layer 328) may need to be applied to this area.

Similarly, the formation of the isolation structures 332 may also be repeated in the word-line driver 204 area, as illustrated. In some embodiments, the isolation structures 332 may be omitted from this portion of the memory device 100.

The base layer 328 may have intrinsic resistivity and this resistivity may be controlled and used for forming the pull-up resistor 220. As illustrated, the memory array 102 may be connected by way of the conductive interconnect 348 to the base layer 328 in the word-line driver 204 area. The n+ strap 334c may be connected to another conductive interconnect 354 to a routing line 356 connected to $V_{DX}$. The other routing line 350 may be connected to the drain of the nMOS (i.e., nMOS 222 illustrated in FIG. 2).

To control the resistivity of the pull-up resistor 220, the distance and/or doping between the n+ straps 334b and 334c may be controlled. For example, the resistivity may be increased by increasing the distance between the n+ straps 334b and 334c, and similarly, decreased by decreasing the distance between the n+ straps 334b and 334c. In various embodiments, the doping level of the base layer 328, at least in the word-line driver 204 area, may be controlled to adjust the resistivity.

Figure 4:
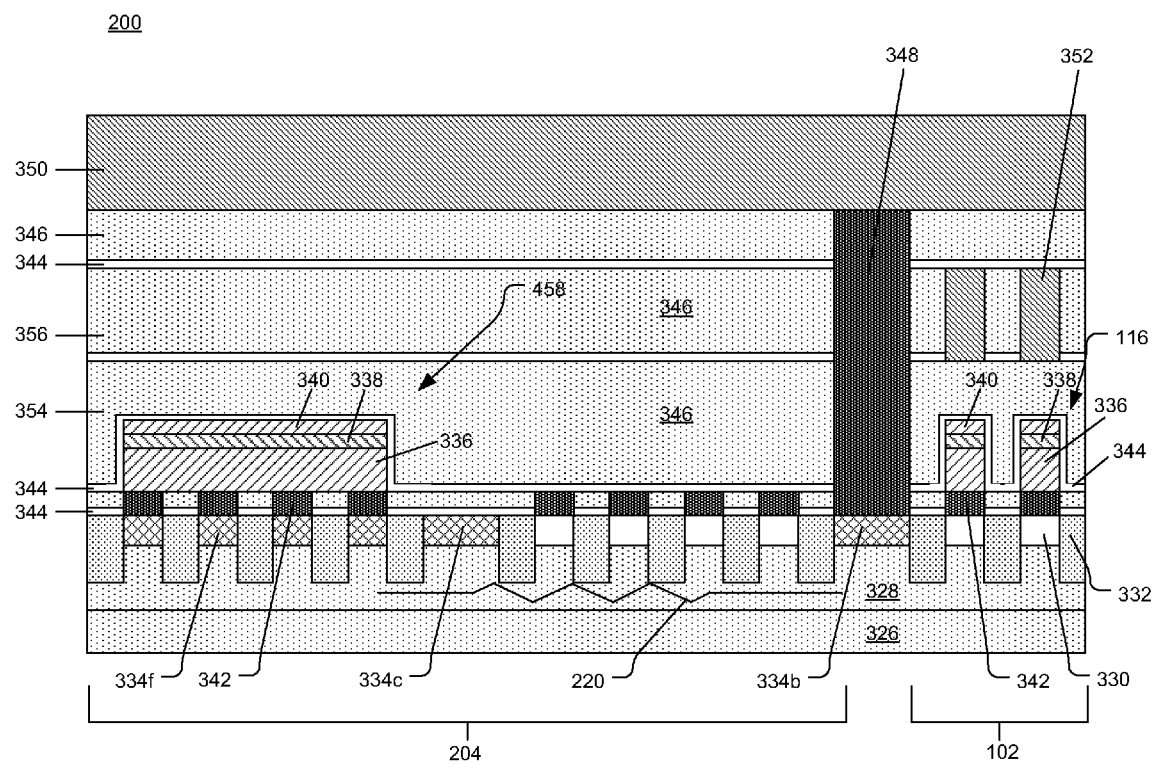
FIG. 4 illustrates another example architecture of the memory device of FIG. 2.

FIG. 4 illustrates another example architecture of the memory device 200 of FIG. 2. Features similar to those illustrated in FIGS. 3a and 3b are denoted using the same reference numerals, and thus, may not be described again.

Similarly to the embodiment described with reference to FIGS. 3a and 3b, the memory array 102 may be connected by way of the conductive interconnect 348 to the base layer 328 in the word-line driver 204 area. The n+ straps 334b (334a not illustrated for simplicity) may be connected to interconnects 348 (e.g., tungsten), which are connected to routing lines 350 (e.g., copper). The routing line 350 may be connected to the drain of the nMOS (i.e., nMOS 222 illustrated in FIG. 2). In the illustrated embodiment, however, the pull-up resistor 220 may be connected to a dummy storage element structure 458, which may be connected to $V_{DX}$.

Like the actual storage elements 116, the dummy storage element structure 458 includes the heater element 336, the layer of phase-change material 338 on the heater element 336, and the conductive cap layer 340 on the layer of phase-change material 338. Similarly, the conductive contacts 342 may also be present. The only difference with respect to the actual storage elements in the array 102 is the absence of the emitter on top of the pillars. Indeed, emitters may be replaced by n+ straps 334f in order to guarantee an ohmic contact at the end of the pull-up resistor 220. By using some of the elements used by the active memory array area, the number and/or complexity of the process for making the memory device may be minimized since separate processing may be avoided, at least in part. Moreover, the actual pitch between the dummy storage element structures 458 along the bit-line direction may be double that of the pitch between the actual storage elements 116. This is due to the word-lines being alternately decoded, such that a single word-line driver 204 may be alternately connected to adjacent word-lines of the memory array 102.

Figure 5:
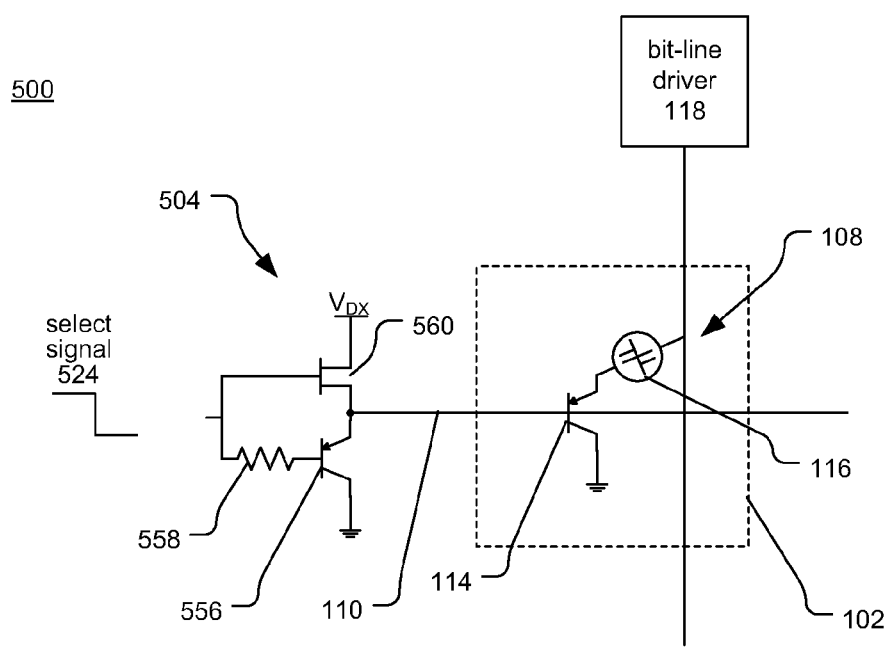
FIG. 5 is a circuit diagram of another example memory device including a word-line driver in accordance with various embodiments.

Another example embodiment of a memory device 500 is illustrated at FIG. 5. As illustrated, the memory device 500 includes a bit-line driver 118 and a word-line driver 504. The word-line driver 504 includes a pull-down transistor 556 coupled to the selectors 114 by way of the word-line 110. Although the illustrated memory array 102 depicts only a single memory cell 108 including a selector 114 and a storage element 116 for simplicity, it is generally understood that the memory array 102 may include up to thousands of memory cells or more.

The pull-down transistor 556 may be coupled to the selectors 114, by way of the word-line 110, for accessing respective storage elements 116 of the memory cells 108. As illustrated, the pull-down transistor 556 is a pnp BJT with its emitter coupled to the source of an nMOS transistor 560 having its drain coupled to receive $V_{DX}$. As illustrated, the word-line driver 504 further includes a resistor 558 coupled to the base of the pull-down transistor 556, coupling the base of the pull-down transistor 556 with the gate of the nMOS transistor 560.

The gate of the nMOS transistor 560 and the base of the pull-down transistor 556 are configured to receive the select signal 524 for accessing the respective storage elements 116 of the memory cells 108. Accordingly, when the select signal 524 is low, the word-line 110 is driven low (e.g., to ground as illustrated or to some other voltage lower than $V_{DX}$). On the other hand, when the select signal 524 is high, the word-line 110 is driven high to $V_{DX}$. The resistor 558 may help prevent a possible current spike when the select signal goes from high to low since the word-line 110 is still high at the beginning of the transition and the emitter-base junction of the pull-down transistor 556 could otherwise see an unbearable bias.

Figure 6:
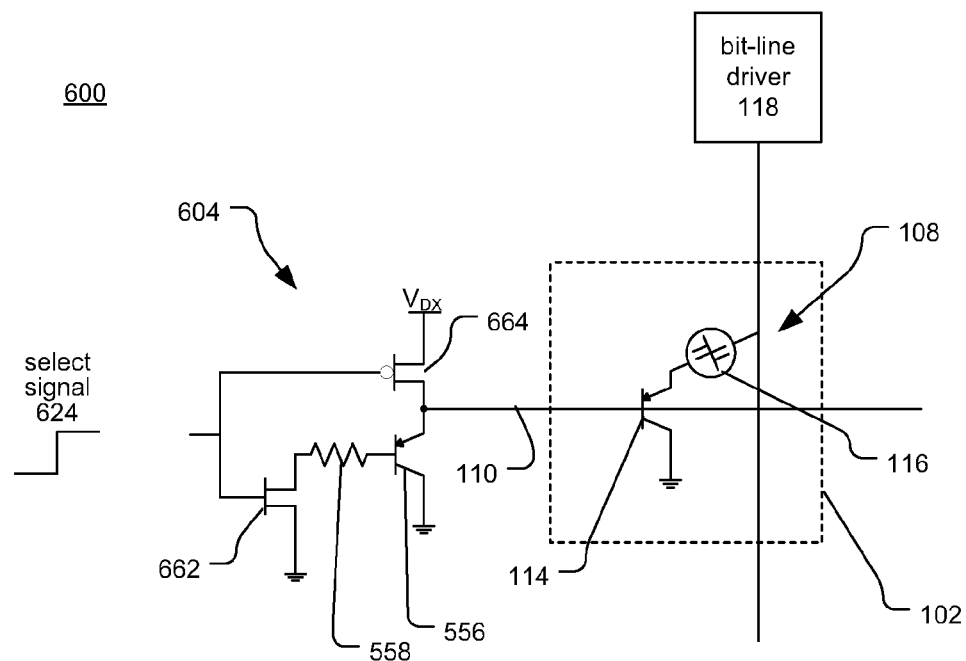
FIG. 6 is a circuit diagram of another example memory device including a word-line driver in accordance with various embodiments.

Still another example embodiment of a memory device 600 is illustrated at FIG. 6. In various embodiments, a small nMOS transistor 662 may be included in the word-line driver 604. The nMOS transistor 662 may be desirable if the driving capability of the selecting stage is not high enough to drain the base current of the pull-down transistor 556. The illustrated word-line driver 604 is somewhat similar to the word-line driver 504 illustrated in FIG. 5. For example, the word-line driver 604 includes a pull-down transistor 556 coupled to the selectors 114 by way of the word-line 110. The word-line driver 604 also includes a resistor 558 coupled to the base of the pull-down transistor 556.

The base of the pull-down transistor 556, however, is coupled to the drain of the nMOS transistor 662 (rather than the gate of the nMOS transistor 560 as illustrated in FIG. 5). The gate of the nMOS transistor 662 and the gate of a pMOS transistor 664 are configured to receive the select signal 624 for accessing the respective storage elements 116 of the memory cells 108. Accordingly, when the select signal 624 is high, the word-line 110 is driven low (e.g., to ground as illustrated or to some other voltage lower than $V_{DX}$). On the other hand, when the select signal 624 is low, the word-line 110 is driven high to $V_{DX}$.

It should be noted that the nMOS transistor 662 can be relatively small, with respect to nMOS transistors sometimes found in conventional word-line drivers, since the current flowing between its drain and source when selected is less than the whole current exiting from the word-line 110. Instead, the current is $I_{WL}/\beta$, where $I_{WL}$ is the word-line current and $\beta$ is the actual gain (usually between 3 and 10) of the pull-down transistor 556. Accordingly, the word-line driver 604 may be smaller than conventional word-line drivers (e.g., word-line drivers including a CMOS inverter).

Figure 7:
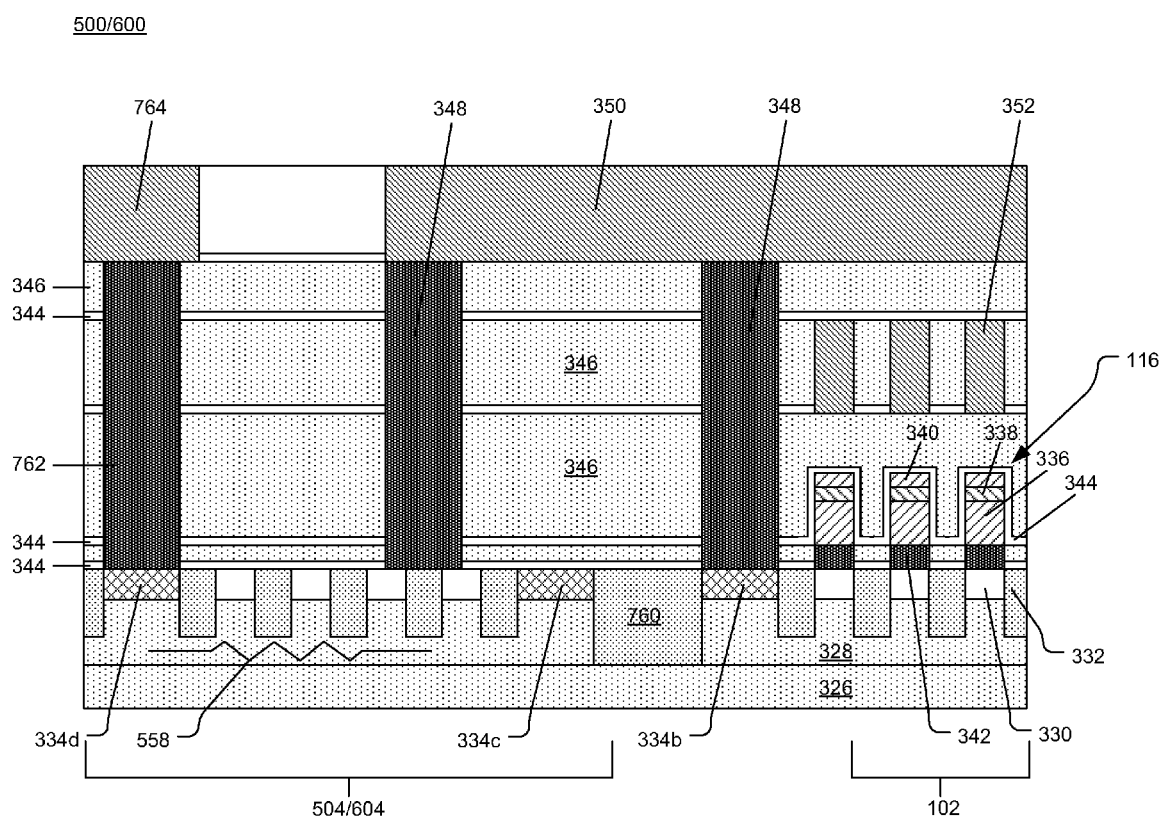
FIG. 7 illustrates an example architecture of the memory devices of FIGS. 5 and 6.

FIG. 7 illustrates an example architecture of the memory devices 500/600 of FIGS. 5 and 6. Features similar to those illustrated in FIGS. 3a and 3b are denoted using the same reference numerals, and thus, may not be described again.

Similarly to the embodiment described with reference to FIGS. 3a and 3b, the memory array 102 may be connected by way of the conductive interconnects 348 and the n+ strap 334b to the base layer 328 in the word-line driver 504/604 area. The n+ strap 334b of the memory array 102 and the word-line driver 504 or 604 may be connected to conductive interconnects 348 (e.g., tungsten), which are connected to routing lines 350 (e.g., copper). The routing line 350 may be connected to the either the nMOS 560 or pMOS 664 (illustrated in FIGS. 5 and 6, respectively).

The word-line driver 504/604 includes the resistor 558 between the n+ straps 334c, 334d. The n+ strap 334d may be connected by conductive interconnect 762 and routing line 764 to either the gate of the nMOS 560 or the drain of the nMOS transistor 662 (illustrated in FIGS. 5 and 6, respectively).

The memory array 102 may be separated from the word-line driver area 504/604 by an isolation structure 760 (e.g., deep trench isolation comprising a suitable dielectric material).

Figure 8:
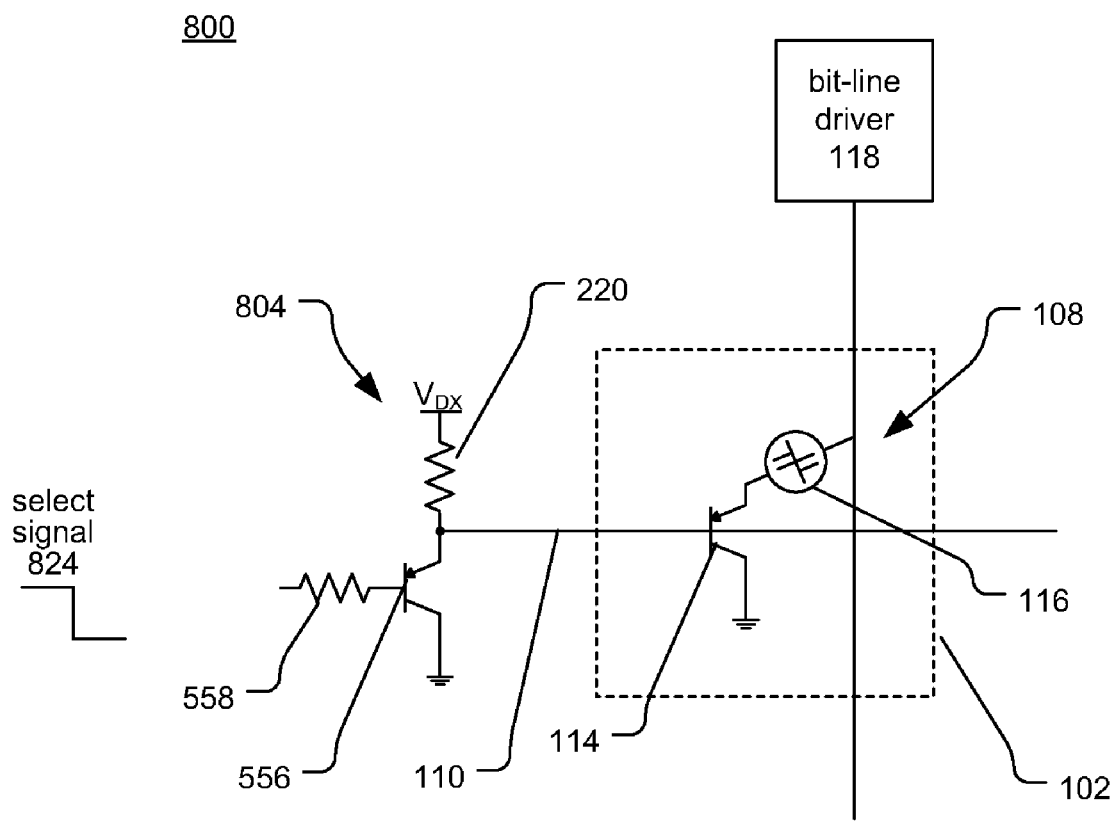
FIG. 8 is a circuit diagram of another example memory device including a word-line driver in accordance with various embodiments.

Any one or more elements of the word-line drivers described herein may be combined, in building-block fashion. As illustrated in FIG. 8, for example, a memory device 800 includes a bit-line driver 118 and a word-line driver 804. The word-line driver 804 includes a passive pull-up resistor 220 and a pull-down transistor 556, and is coupled as illustrated to the selectors 114 by way of the word-line 110.

The pull-down transistor 556 and pull-up resistor 220 may be coupled to the selectors 114, by way of the word-line 110, for accessing respective storage elements 116 of the memory cells 108. As illustrated, the pull-down transistor 556 is a pnp BJT with its emitter coupled to the pull-up resistor 220, which is configured to passively deliver a deselecting voltage $V_{DX}$ to the memory array 102. As illustrated, the word-line driver 804 further includes a resistor 558 coupled to the base of the pull-down transistor 556.

The pull-down transistor 556 is configured to receive the select signal 824, by way of the resistor 558, for accessing the respective storage elements 116 of the memory cells 108. Accordingly, when the select signal 824 is high, the word-line 110 is driven high to $V_{DX}$. On the other hand, when the select signal 824 is low, the word-line 110 is driven low (e.g., to ground as illustrated or to some other voltage lower than $V_{DX}$). As noted herein, the resistor 558 may help prevent a possible current spike when the select signal goes from high to low since the word-line 110 is still high at the beginning of the transition and the emitter-base junction of the pull-down transistor 556 could see an unbearable bias otherwise.

Figure 9:
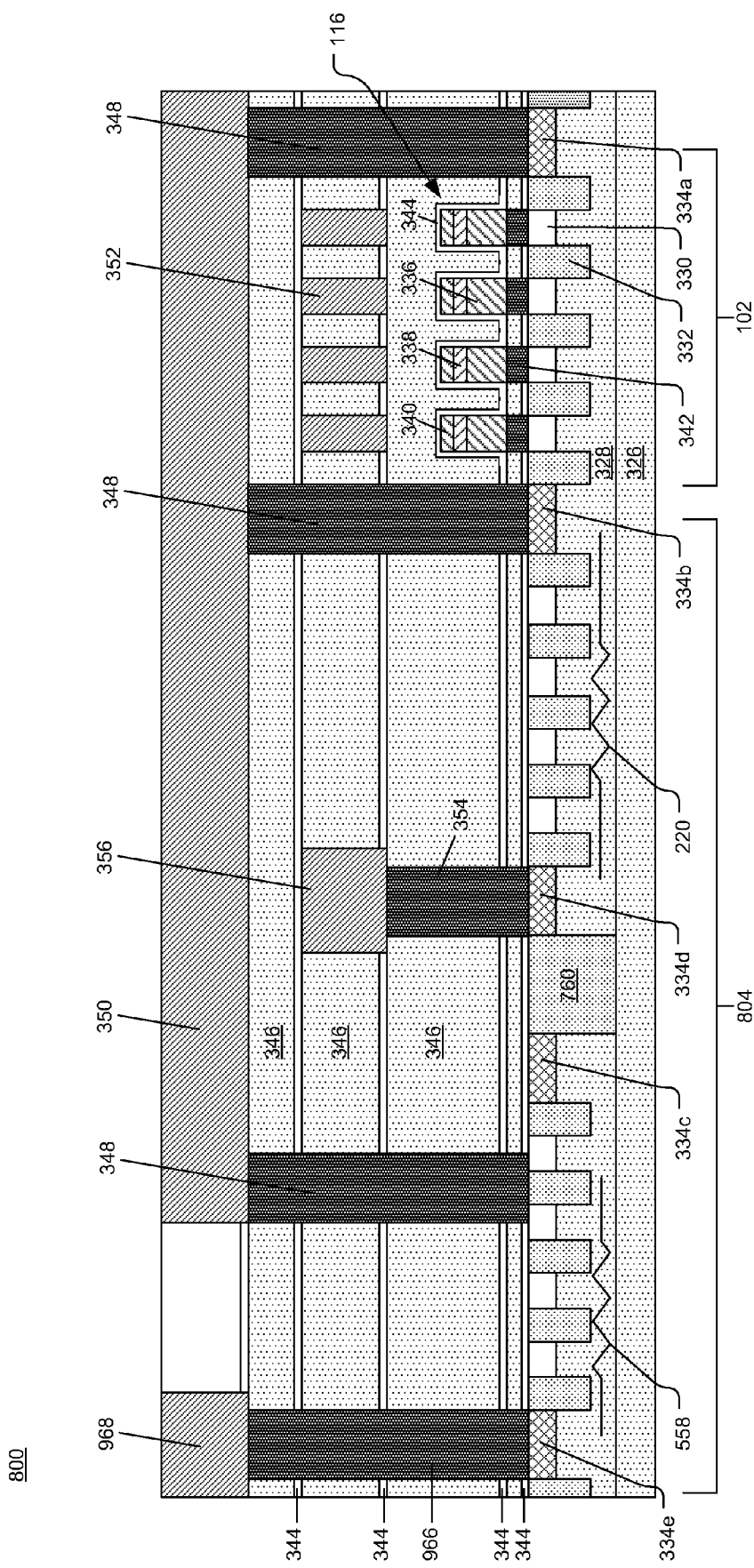
FIG. 9 illustrates an example architecture of the memory device of FIG. 8.

FIG. 9 illustrates an example architecture of the memory device 800 of FIG. 8. Features similar to those illustrated in FIGS. 3a and 3b are denoted using the same reference numerals, and thus, may not be described again.

Similarly to the embodiment described with reference to FIGS. 3a and 3b, the word-lines of the memory cells (the BJTs and the phase-change storage elements 116) may be bounded by n+ straps 334a, 334b as illustrated. The n+ straps 334a, 334b may be connected to conductive interconnects 348 (e.g., tungsten), which are connected to routing lines 350 (e.g., copper). The bit-lines may be connected by another set of routing lines 352.

The memory array 102 may be connected by way of the n+ strap 334b and the conductive interconnects 348 to the base layer 328 in the word-line driver 804 area. The n+ straps 334a, 334b may be connected to conductive interconnects 348, which are connected to routing lines 350 (e.g., copper) forming the word-line. The n+ strap 334d may be connected by the conductive interconnect 354 and routing line 356 to $V_{DX}$.

The word-line driver 804 includes the resistor 220 between the n+ straps 334b and 334d, and the resistor 558 between the n+ straps 334c, 334e. The n+ strap 334e may be connected by conductive interconnect 966 and routing line 968 to receive the select signal 824 (illustrated in FIG. 8) for accessing the respective storage elements 116 of the memory cells of the memory array 102.

The resistor 220 may be separated from the resistor 558 by an isolation structure 760 (e.g., deep trench isolation comprising a suitable dielectric material).

Figure 10:
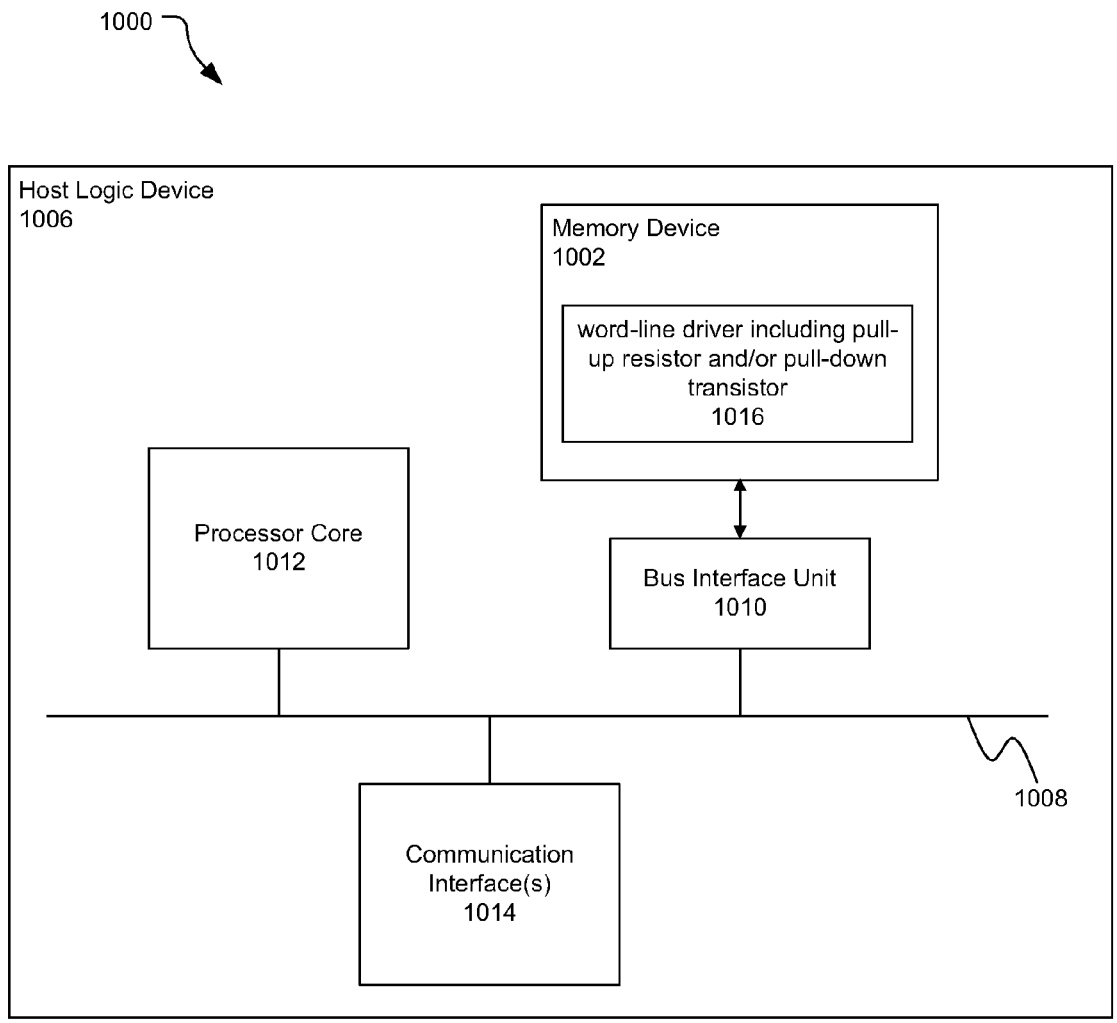
FIG. 10 is a block diagram of an example system incorporating a memory device having a word-line driver in accordance with various embodiments

Embodiments of memory devices described herein may be incorporated into various apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an exemplary system 1000 is illustrated in FIG. 10. As illustrated, the system 1000 may include a memory device 1002. The memory device 1002 may include a word-line driver 1016 including a pull-up resistor and/or a pull-down transistor coupled to the selectors of the memory cells for the memory cells to access respective storage elements of the memory cells. Example word-line drivers may include any one or more of the word-line drivers 204, 504, 604, and 804 described herein with reference to FIGS. 2, 5, 6, and 8, respectively.

In various embodiments, the memory device may be embedded in a host logic device 1006. The host logic device 1006 may be any device type for which flash memory may be embedded. For example, in various embodiments, the host logic device 1006 may be a microcontroller or a digital signal processor. Other device types may be similarly suitable. The host logic device 1006 may include a processor core 1012.

The system 1000 may comprise a host logic device bus 1008, and a bus interface unit 1010 operatively coupling the memory device 1002 and the host logic device bus 1008.

The system 1000 may include communications interface(s) 1014 to provide an interface for system 1000 to communicate over one or more networks and/or with any other suitable device. Communications interface(s) 1014 may include any suitable hardware and/or firmware. Communications interface(s) 1014 for one embodiment may include, for example, a network adapter, a wireless network adapter, a telephone modem, and/or a wireless modem. For wireless communications, communications interface(s) 1014 for one embodiment may use one or more antennas (not illustrated).

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Similarly, memory devices of the present disclosure may be employed in host devices having other architectures. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
    a plurality of memory cells, each memory cell including a selector and a storage element coupled to the selector; and
    a word-line driver including a pull-up resistor coupled to the selectors for the memory cells to access respective storage elements of the memory cells, wherein the pull-up resistor is a diffused resistance of a base of the selector.

2. The apparatus of claim 1, wherein at least one selector of a memory cell coupled to the word-line comprises a pnp bipolar junction transistor.

3. The apparatus of claim 1, wherein at least one storage element of a memory cell coupled to the word-line comprises a phase-change material.

4. The apparatus of claim 1, further comprising an n-type metal-oxide-semiconductor (nMOS) transistor having a drain coupled to the pull-up resistor and the selectors of the memory cells coupled to the word-line.

5. The apparatus of claim 4, wherein a gate of the nMOS transistor is configured to receive a select signal for accessing the respective storage elements of the memory cells coupled to the word-line.

6. The apparatus of claim 1, further comprising a pull-down transistor coupled to the pull-up resistor and the selectors of the memory cells coupled to the word-line.

7. The apparatus of claim 6, wherein the pull-down transistor comprises a pnp bipolar junction transistor having a base configured to receive a select signal to access the respective storage elements of the memory cells coupled to the word-line.

8. The apparatus of claim 1, further comprising a memory array including the plurality memory cells and the word line, and another plurality of memory cells and another word line similarly constituted and coupled as the memory cells and the word line.

9. A method comprising:
   forming a plurality of memory cells, each memory cell including a selector and a storage element coupled to the selector;
   forming a word line coupled to the memory cells; and
   forming a word-line driver including a pull-up resistor coupled to the word line and the selectors of the memory cells coupled to the word line, wherein the pull-up resistor is formed from a diffused resistance of a base of the selector.

10. The method of claim 9, wherein the forming of the plurality of memory cells comprises:
    forming the selectors of the memory cells by forming an array of vertical pnp bipolar junction transistors (BJT); and
    forming the storage elements of the memory cells by forming a phase change material over emitters of the vertical pnp BJTs.

11. The method of claim 10, wherein the array of vertical pnp BJTs includes a common base coupled to the pull-up resistor.

12. The method of claim 9, wherein the forming of the word-line driver includes forming the pull-up resistor in the common base.

13. A system comprising:
    a memory device including:
       a plurality of memory cells, each memory cell including a selector and a storage element constituted with phase change material and coupled to the selector; and
       a plurality of word lines coupled to selectors of corresponding subsets of the memory cells, each word line having a word-line driver including a pull-up resistor coupled to the selectors of the corresponding subset of memory cells to access respective storage elements of the corresponding subset of memory cells, wherein the pull-up resistor is a diffused resistance of a base of the selectors;
    a host logic device bus; and
    a bus interface unit operatively coupled between the memory device and the host logic device bus.

14. The system of claim 13, wherein the memory device and the bus interface unit form an embedded memory module.

15. The system of claim 13, wherein the system is a selected one of a desktop or laptop computer, a server, a set-top box, a digital reorder, a game console, a personal digital assistant, a mobile phone, a digital media player, or a digital camera.

* * * * *